United States Patent [19]
Morozov et al.

[11] Patent Number: 5,509,266
[45] Date of Patent: Apr. 23, 1996

[54] DEVICE FOR MEASURING VARIATIONS IN THE THRUST OF A PLASMA ACCELERATION WITH CLOSED ELECTRON DRIFT

[75] Inventors: Alexei Morozov; Antonina Bougrova; Vadim Kharchevnikov, all of Moscou, Russian Federation; Dominique Valentian, Rosny, France

[73] Assignee: Societe Europeenne de Propulsion, Suresnes, France

[21] Appl. No.: 381,866

[22] PCT Filed: Jun. 21, 1993

[86] PCT No.: PCT/FR93/00609

§ 371 Date: Feb. 15, 1995

§ 102(e) Date: Feb. 15, 1995

[87] PCT Pub. No.: WO95/01085

PCT Pub. Date: Jan. 5, 1995

[51] Int. Cl.⁶ .................................................. F03H 1/00
[52] U.S. Cl. ................................ 60/203.1; 315/111.41
[58] Field of Search .................................. 60/200.1, 202, 60/203.1, 204; 315/111.21, 111.41, 111.61

[56] References Cited

U.S. PATENT DOCUMENTS

| | | | |
|---|---|---|---|
| 4,821,508 | 4/1989 | Burton et al. | 60/203.1 |
| 5,051,659 | 9/1991 | Uhm et al. | 315/111.21 |
| 5,241,244 | 8/1993 | Cirri | 315/111.41 |

OTHER PUBLICATIONS

"Experimental Study of the Azimuthal Electron Drift Current in Hall Accelerators," Barkalov, et al, vol. 35, No. 2, Feb. 1990, New York, pp. 238–239, Soviet Phys. Tech. Phys.

"Determination of the Radial Center of Gravity of an Azimuthal Drift Current In Accelerators with Closed Electron Drift", A. I. Bugrova, et al, vol. 25, No. 10, Oct. 1980, New York, Soviet Phys. Tech. Phys., pp. 1307–1309.

"Non–Contaminating Electron Density Monitor for RF Induction Plasmas", vol. 34, No. 11, Apr. 1992, New York, pp. 424–XP303314, IBM Technical Disclosure Bulletin.

"Induction Method for Measuring the Azimuthal Drift Current in a Hall–Current Accelerator", V. N. Dem'yanenko, et al, vol. 23, No. 3, Mar. 1978, New York, pp. 376–377, Soviet Phys. Tech. Phys.

"Initial Operating of A 10 ms, Quasi–Steady, Multi—Megawatt, Coaxial Plasma Thruster", J. T. Scheuer, et al, vol. 271/3, Albuquerque, N.M., pp. 1327–1334, Proceedings of th 10th Symposium of Space Nuclear Power and Propulsion, Jan. 10–14, 1993.

*Primary Examiner*—Louis J. Casaregola
*Attorney, Agent, or Firm*—Weingarten, Schurgin, Gagnebin & Hayes

[57] ABSTRACT

A device for measuring variations in the thrust of a plasma accelerator with closed electron drift comprising a main annular channel for ionization and acceleration, at least one hollow cathode disposed outside the main channel and downstream therefrom, an anode, ionizable gas feed means associated respectively with the hollow cathode and with the anode, and magnetic field creation means. The device comprises a plurality of magnetic flux sensors (101 to 104; 31 to 33) disposed around the acceleration channel (24), a plurality of amplifiers (111 to 114) whose inputs receive the respective signals delivered by the magnetic flux sensors (101 to 104; 31 to 33) and a summing circuit (115) whose inputs are connected to the outputs of said amplifiers (111 to 114).

12 Claims, 7 Drawing Sheets

FIG_1

FIG_2

FIG_4

FIG_5

FIG_6

FIG_7

FIG_8

FIG_9

DEVICE FOR MEASURING VARIATIONS IN THE THRUST OF A PLASMA ACCELERATION WITH CLOSED ELECTRON DRIFT

FIELD OF THE INVENTION

The present invention relates to a device for measuring variations in the thrust of a plasma accelerator with closed electron drift comprising a main annular channel for ionization and acceleration, at least one hollow cathode disposed outside the main channel and downstream therefrom, an anode, ionizable gas feed means associated respectively with the hollow cathode and with the anode, and magnetic field creation means.

PRIOR ART

Electrical accelerators are intended essentially for space propulsion applications. As sources of ions or of plasma they are used in terrestrial applications, in particular for ion machining. Because of their high specific impulse (1500 s to 6000 s) they make considerable mass savings possible on satellites compared with accelerators that provide thrust chemically.

Ion thrusters can be divided into several categories. Most ion thrusters have in common the fact that their ionization function is clearly separated from their ion acceleration function.

Plasma accelerators of the "closed electron drift" type, also known as "stationary plasma accelerators", or in the United States of America as "Hall current accelerators" differ from the other categories by the fact that ionization and acceleration are not kept separate and that the acceleration zone includes equal numbers of ions and of electrons, thereby making it possible to eliminate any space charge phenomenon.

Conventional ion thrusters produce thrust F which can be derived analytically from the acceleration voltage V and the ion beam current I using the following equation:

$$F = a.k.I(M.V)^{0.5} \quad (1)$$

where:

a: a coefficient for correcting the divergence of the beam k: a scale factor i: ion current M: atomic mass of the ionized element V: net acceleration voltage.

Stationary plasma accelerators present an ion energy distribution that also depends on operating conditions, so it is therefore not possible to use an identical analytic equation to determine their thrust.

Stationary plasma accelerators are described in an article by L. H. ARTSIMOVITCH, et. al, published in 1974.

Figure 1:
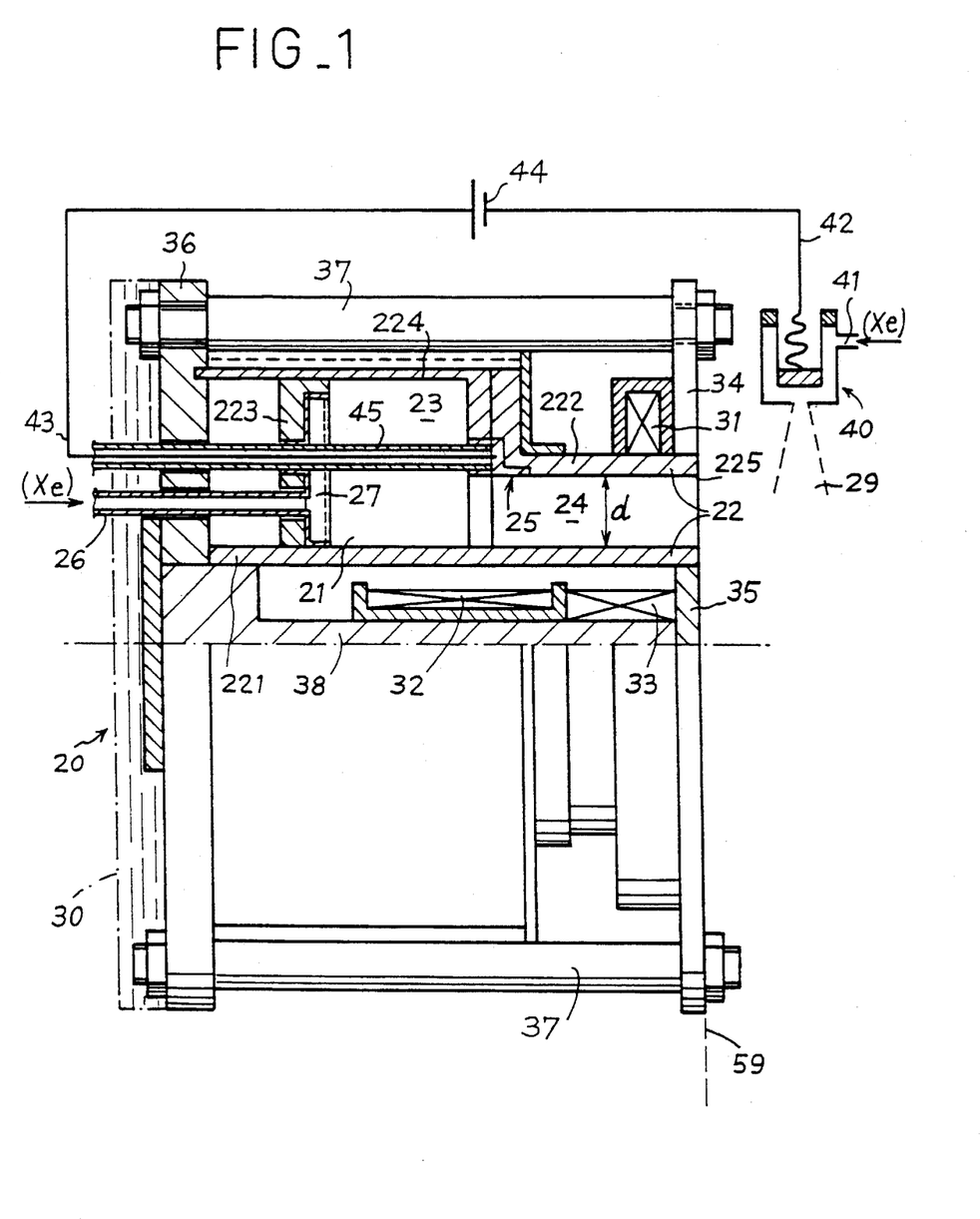
FIG. 1 is a view in elevation and in axial half-section of an example of a plasma accelerator with closed electron drift to which the device of the invention is applicable.

An improved plasma accelerator of the closed electron drift type is described in French patent application 92 08744, filed Jul. 15, 1992 and described briefly with reference to FIG. 1.

FIG. 1 shows an example of a plasma accelerator 20 with closed electron drift which comprises a set of parts 22 made of insulating material defining an annular channel 21 formed upstream from a first part constituted by a buffer chamber 23 and downstream from a second part constituted by an acceleration channel 24.

The radial size of the annular chamber 23 is preferably about twice the radial size of the acceleration annular channel.

An anode 25 is connected by an electrical line 43 to a DC source 44 (which for example, may be at about 200 V to 400 V) and is disposed on the insulating parts 22 defining the annular channel 21, in a zone situated immediately downstream from the buffer chamber 23, at the inlet to the acceleration channel 24. The line 43 for powering the anode 25 is disposed in an insulating tube 45 that passes through the end of the accelerator as constituted by a plate 36 forming a magnetic yoke and through parts 223 and 224 made of insulating material that define the buffer chamber 23.

A tube 26 for feeding ionizable gas, such as xenon, also passes through both the yoke 36 and the end wall 223 of the buffer chamber 23 to open out into an annular gas manifold 27 placed in the end wall of the buffer chamber 23.

The channel 21 defined by the set of insulating parts 22 is placed in a magnetic circuit essentially made up of three coils 31, 32, and 33 and of pole pieces 34 and 35.

External and internal plane pole pieces 34 and 35 are placed in the outlet plane of the accelerator outside the acceleration channel 24, and they define magnetic field lines which are substantially parallel to the outlet plane 59 of the accelerator 20 in the open downstream portion of the acceleration channel 24.

The magnetic circuit constituted by the pole pieces 34 and 35 is closed by an axial central core 38 and by connection bars 37 disposed at the periphery of the accelerator in an essentially cylindrical configuration, with the central core 38 that is made of ferromagnetic material and the connection bars 37 that are also made of ferromagnetic material all being in contact with the rear yoke 36. The yoke 36 which is likewise made of ferromagnetic material and which constitutes the end wall of the accelerator may be protected by one or more layers 30 of thermal superinsulation material which prevents heat flux being radiated towards the satellite.

The electrons necessary for operation of the accelerator are provided by a hollow cathode 40 which may be of conventional design. The cathode 40 which is electrically connected by a line 42 to the negative pole of the voltage source 44 includes a circuit 41 for feeding it with an ionizable gas such as xenon, and is located downstream from the outlet zone of the acceleration channel 24.

The hollow cathode 40 supplies a plasma 29 substantially at the reference potential from which electrons are extracted heading towards the anode 25 under the effect of the electrostatic field E due to the potential difference between the anode 25 and the cathode 40.

These electrons have an azimuth drift trajectory in the acceleration channel 24 under the effect of the electric field E and of the magnetic field B.

Typically, the outlet field from the channel 24 is 150 Oe to 200 Oe.

The primary electrons are accelerated by the electrostatic field E and strike against the insulating wall 22, thereby supplying secondary electrons at lower energy.

The electrons come into collision with neutral xenon atoms coming from the buffer chamber 23.

The xenon ions formed in this way are accelerated in the acceleration channel 24 by the electrostatic field E.

There is no space charge in the acceleration channel 24 because of the presence of the electrons.

The ion beam is neutralized by a fraction of the electrons coming from the hollow cathode 40.

The gradient of the radial magnetic field is kept under control by the disposition of the coils 31 to 33 and of the pole pieces 34 and 35 which makes it possible to separate the function of accelerating the ions from the ionization function obtained in a zone close to the anode 25.

There are several ways in which such accelerators can be regulated:

In a first method, the flow rate of thrust gas (xenon) is determined merely by calibrated holes. The accelerator then has no active setting.

In another method, the discharge current is regulated by negative feedback on the xenon flow rate by using a valve or a heated capillary.

That method is approximate since it is the discharge current from the accelerator that is regulated and not its thrust. There is therefore no guarantee that thrust will be proportional thereto (and indeed variations of ±10% can be observed).

The above methods imply .that thrust is neither measured nor regulated, which leads to the following drawbacks:

on the ground, during reception testing, thrust must be measured using a balance, and that constitutes a considerable constraint; and in flight:

when two accelerators are simultaneously in operation, which disposition is widespread for north-south correction on geostationary satellites, any thrust unbalance can disturb the attitude of the satellite which must then be corrected by other accelerators, whereas a device for measuring and regulating thrust would enable such relative disturbance to be cancelled; and lack of knowledge about the impulse delivered by the correction makes it necessary to track the trajectory regularly.

OBJECT AND BRIEF SUMMARY OF THE INVENTION

An object of the present invention is to permit simple and effective measurement of variations in the thrust of a plasma accelerator with closed electron drift.

The invention also seeks to make it easy to determine the thrust of a plasma accelerator on the basis of measured thrust variations.

Another object of the invention consists in actively regulating the thrust of a plasma accelerator on the basis of measured variations in the thrust of the accelerator.

These objects are achieved by a device for measuring variations in the thrust of a plasma accelerator with closed electron drift comprising a main annular channel for ionization and acceleration, at least one hollow cathode disposed outside the main channel and downstream therefrom, an anode, ionizable gas feed means associated respectively with the hollow cathode and with the anode, and magnetic field creation means.

According to the invention, the device comprises a plurality of magnetic flux sensors disposed around the acceleration channel, a plurality of amplifiers whose inputs receive the respective signals delivered by the magnetic flux sensors, and a summing circuit whose inputs are connected to the outputs of said amplifiers.

The measurement device further comprises a plurality of weighting circuits interposed between the outputs of said amplifiers and the summing circuit, each weighting circuit weighting the signal from a respective one of the amplifiers with a coefficient that has been determined by calibration.

In which case, the calibration device may comprise a single-turn coil capable of taking up a plurality of axial positions in the acceleration channel to determine the weighting coefficients of the weighting circuits.

In order to provide a direct image of the thrust, the device may also include integrator circuits associated with the amplifiers or an integrator circuit connected to the output of the summing circuit.

In a particular embodiment, the device further comprises a plurality of analog-to-digital converters respectively disposed at the outputs of the amplifiers, and a multiplexer whose inputs receive the signals from the analog-to-digital converters and whose output is connected to the input of the summing circuit to provide a digital type output signal.

Advantageously, the magnetic flux sensors are constituted by coils disposed around the acceleration channel.

In which case, the device preferably comprises a plurality of coils serving as magnetic flux sensors disposed coaxially with the acceleration channel in various radial planes of the acceleration channel.

In a particular embodiment, at least some of the magnetic flux sensors are constituted by coils fed with DC and forming part of said magnetic field creation means, and said magnetic flux sensors constituted by coils fed with DC are connected to respective amplifiers via respective filters eliminating the DC component.

In one possible application of the device of the invention, the signals from the summing circuit are applied to a negative feedback loop in a circuit for controlling a valve that regulates the ionizable gas feed means in such a manner as to maintain the accelerator at constant thrust equal to a predetermined value.

In which case, the feedback loop may be of the digital type, and the reference value for the thrust is stored in a memory.

Nevertheless, it is also possible for the negative feedback loop to be of the analog type, and the reference value for the thrust is provided from a mass flow meter associated with the ionizable gas feed means.

BRIEF DESCRIPTION OF THE DRAWINGS

Other characteristics and advantages of the invention appear from the following description of particular embodiments, given as non-limiting examples and made with reference to the accompanying drawings, in which.

DETAILED DESCRIPTION OF PARTICULAR EMBODIMENTS

Figure 2:
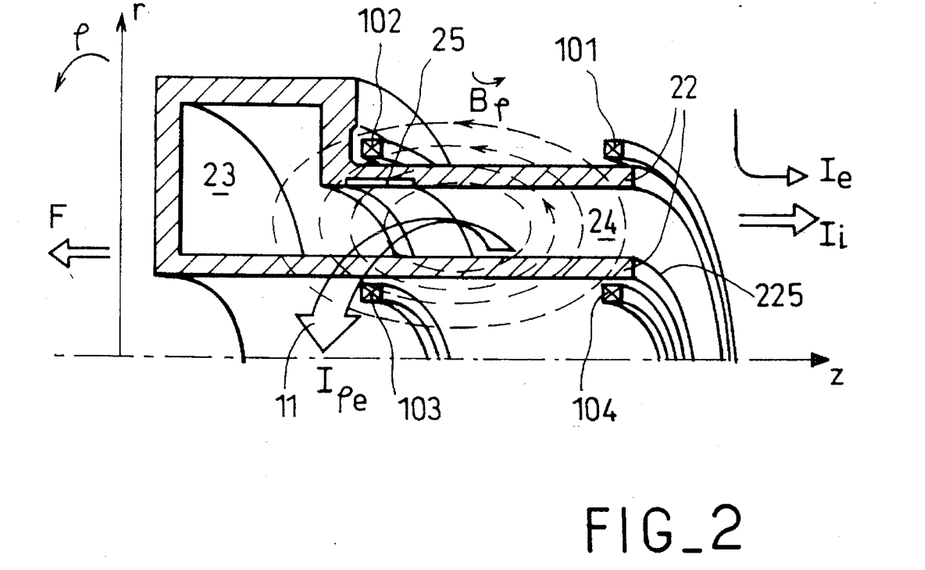
FIG. 2 is a fragmentary diagrammatic view in axial half-section of the FIG. 1 plasma accelerator, showing a portion of the device of the invention for measuring variations in thrust.

FIG. 2 is a diagram showing a portion of the example of a plasma accelerator with closed electron drift as shown in FIG. 1.

In FIG. 2, arrows represent the ion current Ii and the electron current Ie at the outlet from the acceleration channel 24 of the plasma accelerator, and another arrow represents the thrust F of the plasma accelerator. An arrow 11 also represents the azimuth electron current Jpe in the acceleration channel 24.

It has also been established theoretically by A. Morozov, Zubkov and Demjanikov that the azimuth electron current Jpe is proportional to the thrust F in a plasma accelerator with closed electron drift.

The following equation thus applies:

$$F = \alpha \int jpe \, Hz \, dV \text{ i.e. } F = \alpha \, Jpe \int (jpe/Jpe) \, Hz \, dV$$

where

α is a scale factor

V is the net acceleration voltage

Hz is the magnetic field in the acceleration channel

Jpe is the azimuth electron current in the acceleration channel jpe is the azimuth current density.

The azimuth electron current Jpe is not directly accessible for measurement.

In contrast, variations in the azimuth electron current Jpe induce variations in the magnetic flux in the space situated around the acceleration channel of the accelerator. That is why the device 100 of the invention for measuring variations in thrust comprises flux sensors 101 to 104 disposed around the acceleration channel 24.

By way of example, the flux sensors 101 to 104 may be constituted by air coils coaxial with the acceleration channel 24. For example, two pairs of coils 101 & 104 and 102 & 103 may be used, with one pair 101 & 104 being situated in the vicinity of the outlet section 225 of the acceleration channel 24, while the other pair 102 & 103 is in the vicinity of the anode 25 in the portion of the acceleration channel 24 that is closest to the buffer chamber 23. Other pairs of coils could also be disposed in sections inbetween the sections in which the pairs 101 & 104 and 102 & 103 are situated. Each pair of coils 101 & 104 and 102 & 103 comprises one coil 101 or 102 situated in the peripheral portion outside the annular acceleration channel 24, and another coil 104, 103 situated in the central portion inside the acceleration channel 24.

FIG. 2 also shows lines of magnetic induction Bp associated with the azimuth electron current Jpe. Variations $d\Phi/dt$ in the magnetic flux $\Phi$ induced by variations in the azimuth electron current Jpe give rise to variations of current in the coils 101 to 104.

Figure 4:
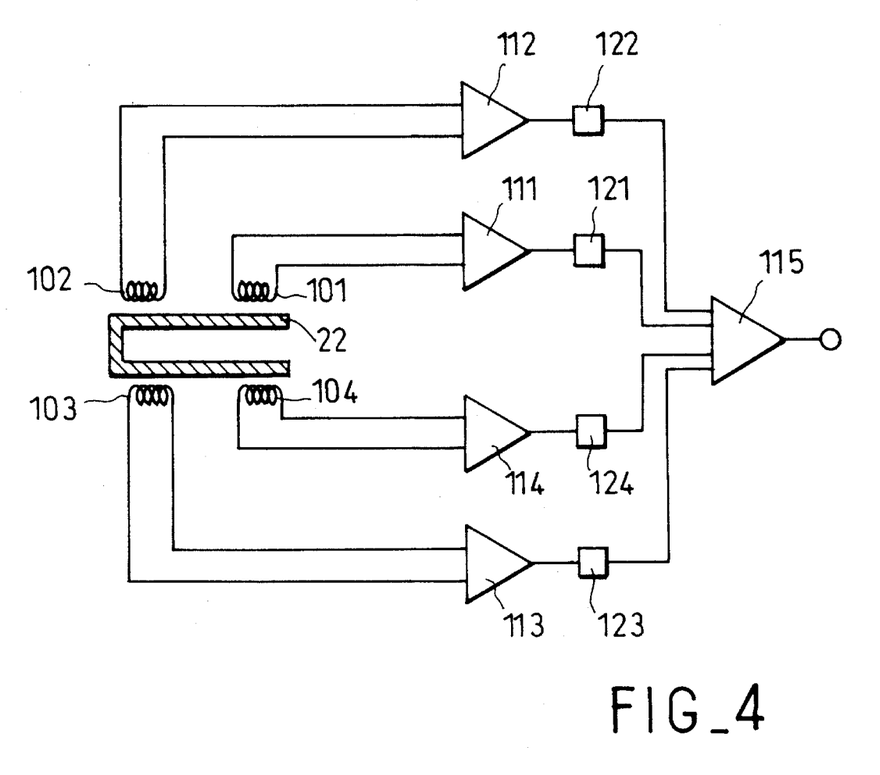
FIG. 4 is a diagrammatic view of the main elements of a device of the invention for measuring variations in thrust.

The coils 101 to 104 are connected to respective inputs of amplifier circuits 111 to 114 whose outputs are connected via weighting circuits 121 to 124 to the inputs of a summing circuit 115 (FIG. 4).

Each weighting circuit 121 to 124 weights the signal issued by a corresponding amplifier 111 to 114 with a coefficient that is determined by calibration.

Figure 7:
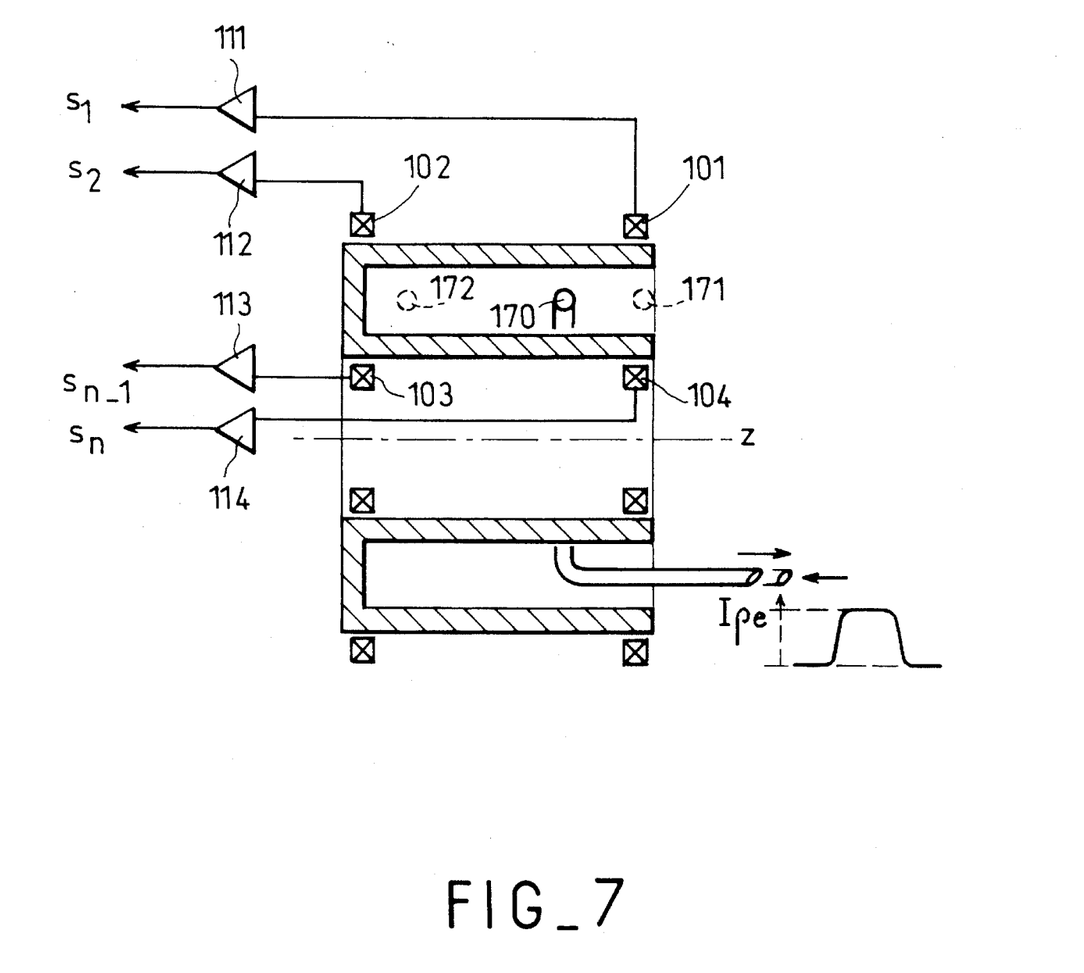
FIG. 7 is a diagrammatic view of a device of the invention to which a calibration element has been added in order to calibrate the signals provided by the sensors of the device.

For a number of coils or other magnetic flux sensors 101 to 104 equal to n, the calibration method may consist in using a single-turn coil 170 placed at a first position along the z-axis of the acceleration channel 24 concentrically with the channel, in causing a calibration signal Ipe to travel round the turn 170 to simulate the azimuth electron current Jpe, in measuring the output signals from the n coils 101 to 104, and then in repeating the operation by placing the turn 170 at another position along the z-axis of the acceleration channel 24. The operation must be repeated k times at k different positions along the z-axis, where k is greater than or equal to the number n of coils 101 to 104. In FIG. 7, dashed lines represent the first position 171 and the k-th position 172 of the coil 170.

A calibration matrix of dimensions n by k is thus obtained giving the correspondence between the output signals $s_1, s_2, \ldots, s_n$ from the sensors 101 to 104, and the calibration current $Ic_1, Ic_2, \ldots, Ic_n$:

$$\begin{vmatrix} s_1 \\ s_2 \\ s_n \end{vmatrix} = \begin{vmatrix} c_{11} & c_{12} & c_{1k} \\ c_{21} & c_{22} & c_{2k} \\ c_{n1} & c_{n2} & c_{nk} \end{vmatrix} * \begin{vmatrix} Ic_1 \\ Ic_2 \\ Ic_n \end{vmatrix} (k \geq n)$$

This matrix makes it possible to establish the sensitivity coefficients that are to be given to the signal $s_i$ from each coil 101 to 104 by the weighting circuits 121 to 124 after amplification and before application of the signals to the summing circuit 115.

Figures 5, 6:
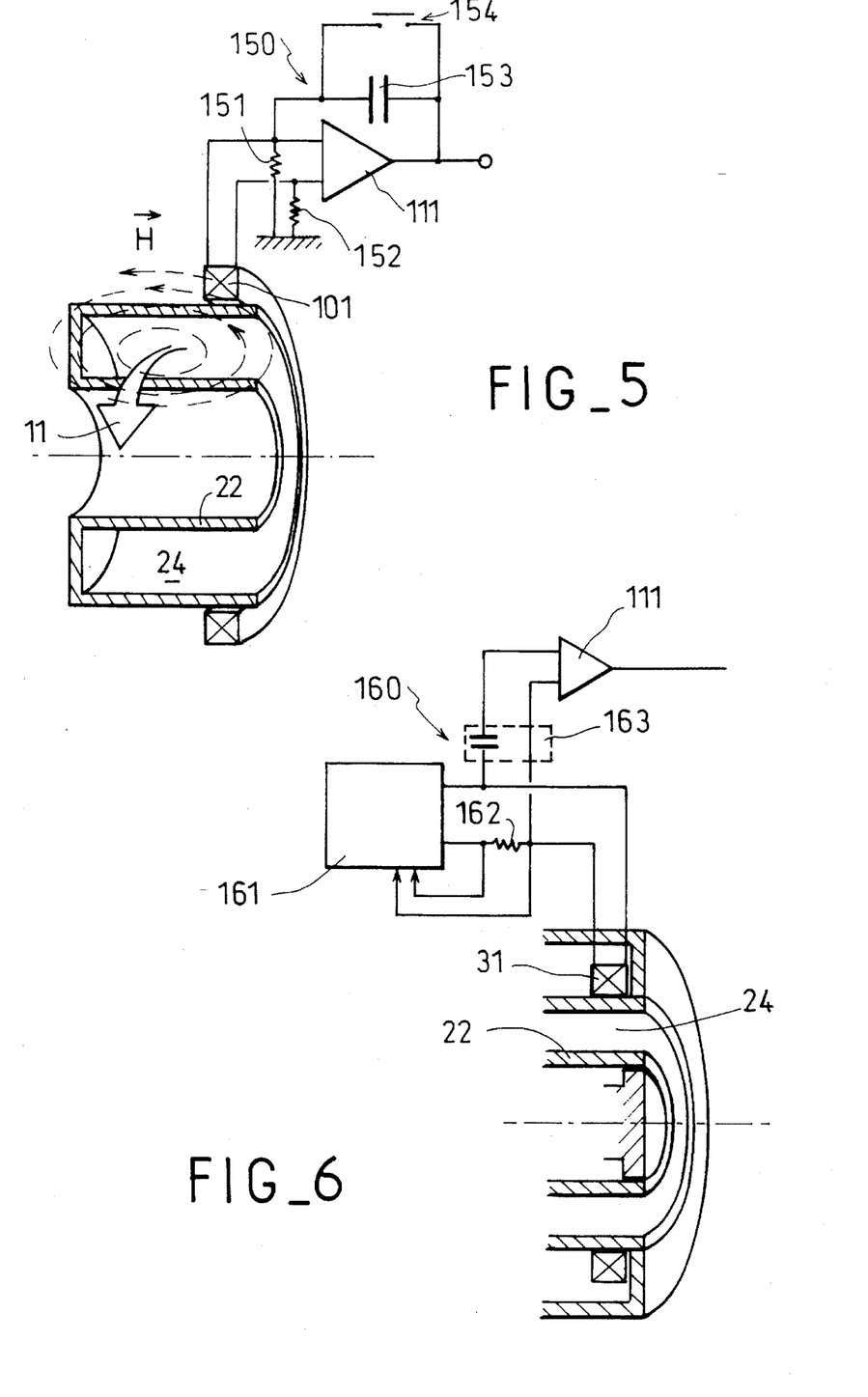
FIG. 5 is a fragmentary view of a particular embodiment of the device of the invention for measuring variations in thrust that uses amplifier-integrators.
FIG. 6 is a fragmentary view of a particular embodiment of the device of the invention for measuring variations in thrust, in which the coils for creating the magnetic field and forming a part of the plasma accelerator also act as sensors for the device of the invention.

In a particular embodiment, shown in FIG. 5, the flux variation sensors such as the coil 101 are connected to respective amplifier-integrators 150. Under such circumstances, the integrated signal from the amplifier-integrator is proportional to the induced current, i.e. to the local variation in flux.

The relationship between the integrated signal from each coil such as the coil 101 and the integral of the azimuth electron current in the channel, i.e. the thrust, can be obtained by applying the calibration method described above. The output signal from the summing circuit 115 in FIG. 4 thus represents thrust F in application of the following equation:

$$F = a \sum_{i=1}^{n} m_j \cdot s_i$$

where:

a: a scale factor $m_j$: the weighting coefficient taking account of the magnetic field Hz at point j in the acceleration channel $s_i$: the output signal from sensor i.

The amplifier-integrator 150 may be implemented in simple manner. FIG. 5 shows an amplifier-integrator 150 built around the amplifier 111 associated with the coil 101. Resistors 151 and 152 are connected between each of the inputs of the amplifier 111 as connected to respective ends of the coil 101, and ground. A capacitor 153 is connected between the output of the amplifier 111 and one of its inputs. A reset pushbutton 154 is connected in parallel with the capacitor 153. For a circuit on board a satellite, the pushbutton is naturally replaced by a relay or a transistor under the control of on-board logic.

The integration function for reconstructing an output signal proportional to thrust rather than to variations in thrust may also be performed downstream from the summing circuit 115, e.g. in digital manner, as described below with reference to FIG. 8.

A particular embodiment of the device of the invention applicable to a plasma accelerator with closed electron drift such as the accelerator described in French patent application 92 08744 filed Jul. 15, 1992 is described below with reference to FIG. 6.

In this particular case, the coils 31 to 33 (see FIG. 1) providing the magnetic field may also serve as sensors when powered with DC from a constant current power supply circuit 161 (FIG. 6). A matching circuit 160 must nevertheless be associated with the coil, e.g. the coil 31, which is required to act both as means for establishing a magnetic field in the acceleration channel 24 and as a sensor of variations in magnetic flux. The matching circuit 160 essentially comprises a filter 163 having a coupling capacitor between one end of the coil 31 and an input of the amplifier 111 in order to remove the DC component at the input of the amplifier 111. A resistor 162 is connected between the constant current power supply circuit 161 and one of the ends of the coil 31 in order to monitor the magnitude of the DC delivered to the coil 31.

Figure 3A:
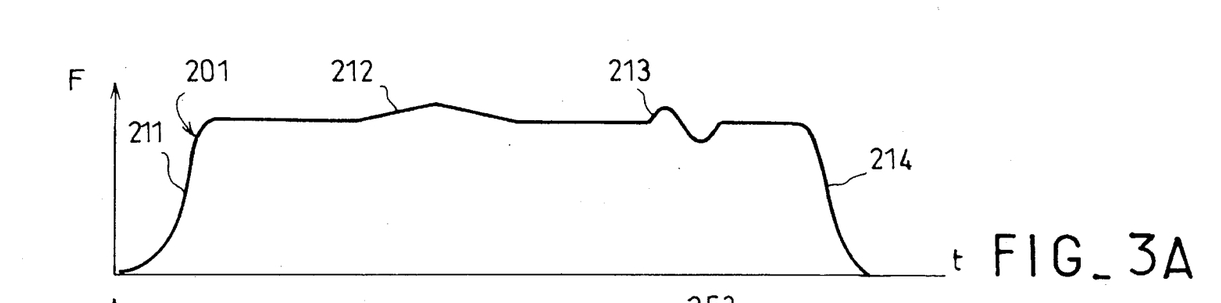
FIGS. 3A to 3D are diagrams showing one example of the way in which the thrust of a plasma accelerator may vary, and the corresponding variation in other magnitudes associated with thrust.

FIG. 3A shows an example of how the thrust F from a plasma accelerator may vary as a function of time. In this case, curve 201 has a rising front 211, a plateau portion that includes a triangular irregularity 212 and a sinusoidal irregularity 213, and a falling front 214.

Figure 3B:
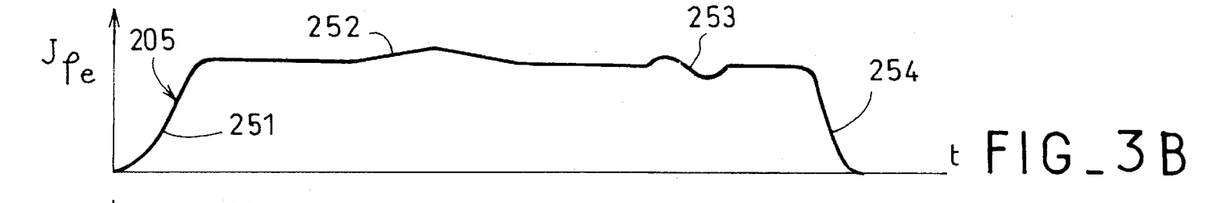

In FIG. 3B, curve 205 shows the form of variations in the azimuth electron current Jpe corresponding to the variations in thrust F shown in FIG. 3A. It may be observed that zones 251 to 254 of curve 205 correspond completely with zones 211 to 214 of curve 201.

Figure 3C:
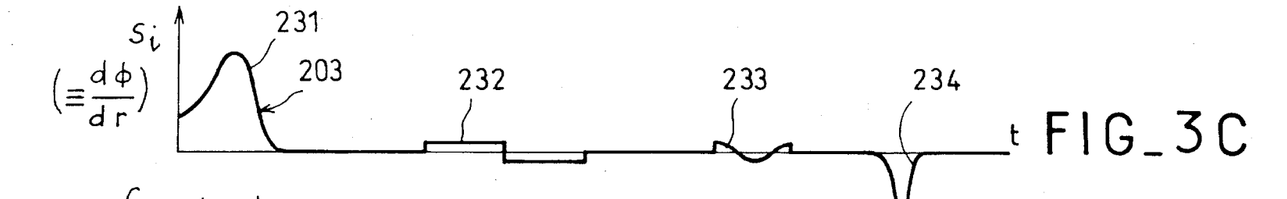

FIG. 3C shows a curve 203 giving the form of the signals si delivered by the magnetic flux variation sensors 101 to 104 in correspondence with the variations in thrust F shown in FIG. 3A. It may be observed that the portions 231, 232, 233, and 234 of curve 203 do indeed correspond to the derivative of the curve 201 in FIG. 3A and thus make it possible to observe the zones 211 to 214 of variation in the amplitude of the curve 201 that corresponds to thrust.

Figure 3D:
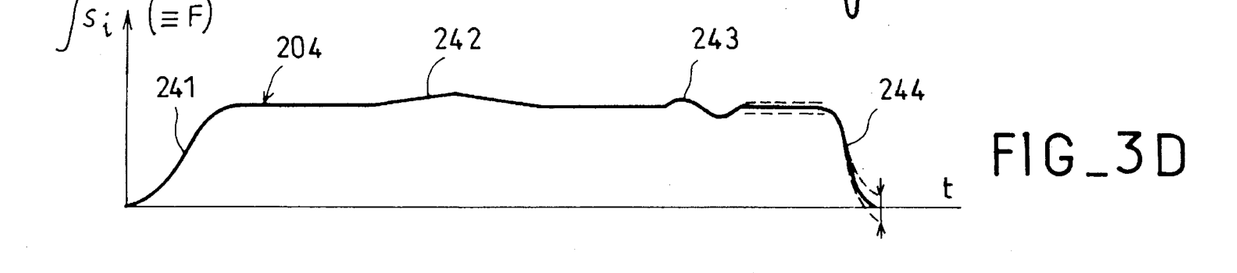

FIG. 3D shows a reconstituted curve 204 obtained by integrating the signal given by curve 203 in FIG. 3C. It can be seen that the reconstituted curve 204 does indeed correspond to the curve 201 of FIG. 3A relating to the thrust F.

The signals delivered by the coils 101 to 104 of the detection device can be used in various different ways.

In a first application, the signals are made use of after integration so as to obtain a signal representative of thrust, and optionally to correct the thrust by means of a regulation loop, by acting on the rate at which thrust gas is injected into the accelerator. This type of application is particularly useful while the accelerator is starting up.

The integrator circuit may be of the analog type and combined with the amplifiers 111 to 114, as described with reference to FIG. 5. The integrator circuit may alternatively be located at the outlet from the summing circuit 115 and may be separate from the amplifiers 111 to 114. Nevertheless, an analog type integrator is always liable to exhibit drift. That is why it may be advantageous to implement a digital type of integrator circuit, as described below with reference to FIG. 8.

Figure 8:
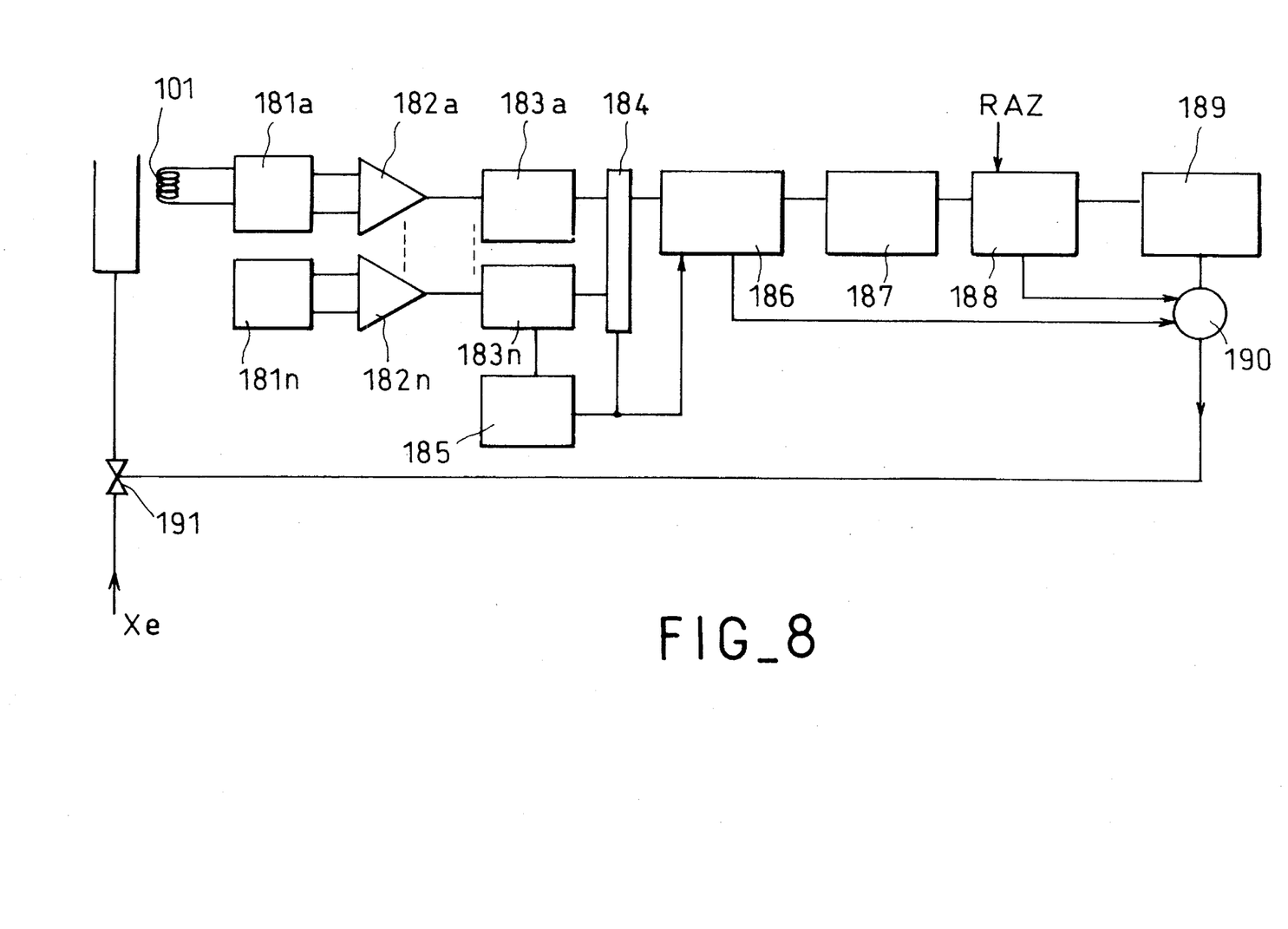
FIG. 8 is a block diagram showing the device of the invention applied to a digital loop for regulating the thrust of a plasma accelerator.

FIG. 8 shows an example of a digital regulation loop in which coils such as the coil 101 are connected via lowpass filters 181a, ..., 181n to the inputs of amplifiers 182a, ..., 182n whose outputs are themselves connected to the inputs of analog-to-digital converters (ADCs) 183a, ..., 183n. The outputs of the analog-to-digital converters 183a, ..., 183n are connected to a multiplexer 184 clocked by a clock 185. The output from the multiplexer 184 is connected to a summing circuit 186 which provides a digital signal representative of the variations in thrust to a comparator 190. A digital integrating circuit 187 is connected to the output of the summing circuit 186 to provide the comparator 190 with an image of the thrust F. A circuit 188 which is connected to the output of the integrating circuit 187 and to the comparator 190 has a reset input and serves to store the integrated value. A circuit 189 also provides the comparator 190 with a thrust reference value. The output from the comparator 190 serves to control a regulation valve 191 placed on the circuit feeding the accelerator with ionizable thrust gas.

Figure 9:
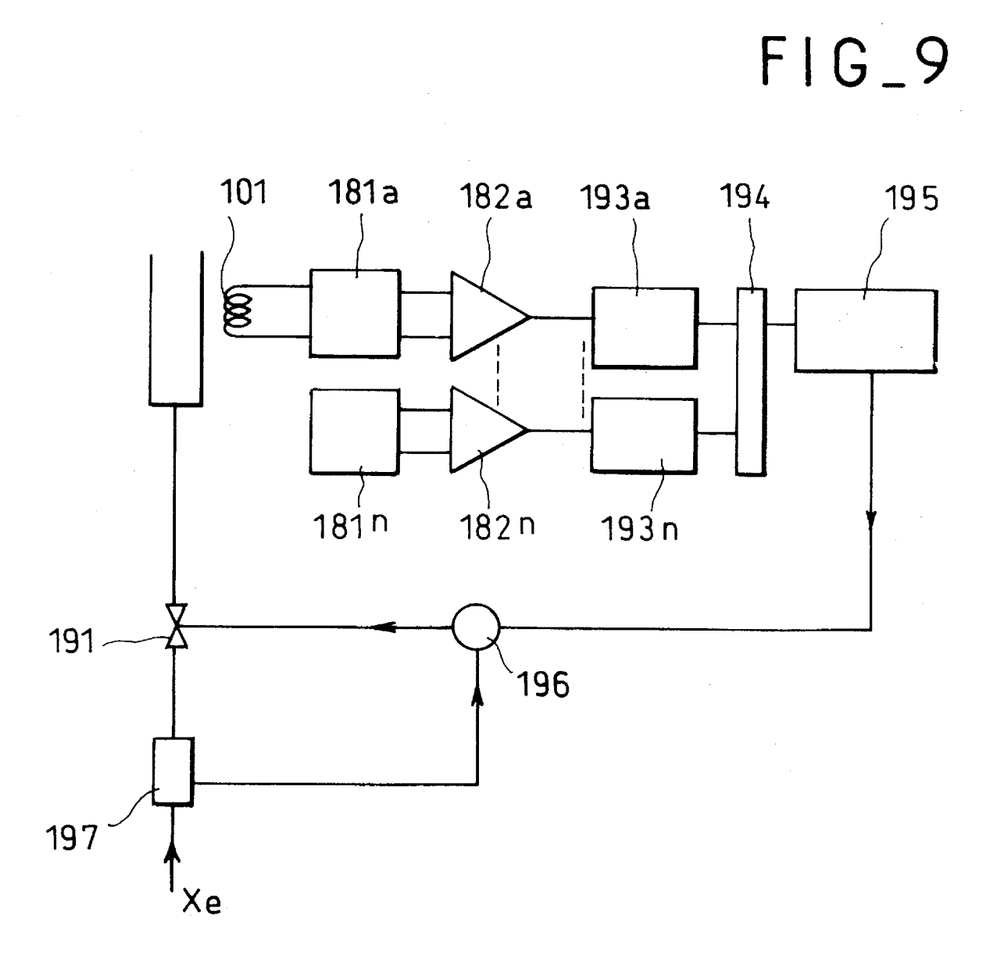
FIG. 9 is a block diagram showing the device of the invention applied to an analog loop for regulating the thrust of a plasma accelerator.

FIG. 9 shows another application of the detection device of the invention. In this case, the signals delivered by the coils such as the coils 101 to 104 are used directly after amplification and summing, but without performing any integration. Use is thus made of signals representative of the derivative of the thrust, such as the signals shown in FIG. 3C, for the purpose of applying negative feedback to the thrust gas feed rate, thereby obtaining constant thrust.

Thus, FIG. 9 shows the sensors such as the coil 101 which are connected via respective lowpass filters 181a, ..., 181n to amplifiers 182a, ..., 182n whose outputs are connected via level-matching circuits 193a, ..., 193n which may correspond to the circuits 121 to 124 of FIG. 4, to summing circuits 194, 195 that provide an output which is connected to a comparator 196, which comparator also has a reference signal applied thereto as constituted by the signal from a mass flow meter 197 placed on the line feeding the accelerator with thrust gas. The output from the comparator 196 serves to control a regulation valve 191 likewise placed on the line for feeding the accelerator with thrust gas.

The device of the invention for measuring the derivative of thrust, and by integration for measuring thrust itself possesses the following advantages:

on the ground, during reception testing, an electrical measurement is easier to perform than a measurement on a thrust balance;

it simplifies controlling the orbit of a geostationary satellite: it is now possible to issue a correction that is accurately calibrated given both the time during which the accelerator operates and its thrust, such that the effect of the accelerator is completely foreseeable, which means that monitoring of orbital parameters can be performed at intervals that are spaced more widely apart;

it contributes to achieving equilibrium in the attitude of a satellite by maintaining equal thrust from two accelerators acting in the same direction;

a device for measuring and regulating thrust makes it possible to cancel any possible thrust imbalance between two accelerators fired simultaneously, thereby eliminating this source of disturbance relating to the attitude of the satellite; conversely, for reasons specific to the satellite, e.g. for the purpose of desaturating reaction wheels, it is possible to set up a thrust difference between the two accelerators deliberately in order to induce a known torque; and the ability to regulate thrust directly makes it possible to monitor drag actively for satellites in low orbit.

What we claim is:

1. A device for measuring variations in the thrust of a plasma accelerator with closed electron drift comprising a main annular channel (24) for ionization and acceleration, at least one hollow cathode (40) disposed outside the main channel and downstream therefrom, an anode (25), ionizable gas feed means (41, 26) associated respectively with the hollow cathode (40) and with the anode (25), and magnetic field creation means (31 to 33), the device being characterized in that it comprises a plurality of magnetic flux sensors (101 to 104; 31 to 33) disposed around the acceleration channel (24), a plurality of amplifiers (111 to 114) whose inputs receive the respective signals delivered by the magnetic flux sensors (101 to 104; 31 to 33), and a summing circuit (115) whose inputs are connected to the outputs of said amplifiers (111 to 114).

2. A device according to claim 1, characterized in that it further comprises a plurality of weighting circuits (121 to 124) interposed between the outputs of said amplifiers (111 to 114) and the summing circuit (115), each weighting circuit (121 to 124) weighting the signal from a respective one of the amplifiers with a coefficient that has been determined by calibration.

3. A device according to claim 2, characterized in that calibration is performed by means of a single-turn coil (170) suitable for taking up a plurality of axial positions (171, 172) in the acceleration channel (24) to determine the weighting coefficients of the weighting circuits (121 to 124).

4. A device according to claim 1, characterized in that it further comprises integrator circuits (150) associated with the amplifiers (111 to 114) to deliver a direct image of the thrust.

5. A device according to claim 1, characterized in that it further comprises an integrator circuit (187) connected in series with the summing circuit (115; 186) to provide a direct image of the thrust.

6. A device according to claim 1, characterized in that it further comprises a plurality of analog-to-digital converters (183*a*, 183*b*) respectively disposed at the outputs of the amplifiers (111 to 114; 182*a*, 182*b*), and a multiplexer (184) whose inputs receive the signals from the analog-to-digital converters (183*a*, 183*b*) and whose output is connected to the input of the summing circuit (115; 186) to provide a digital type output signal.

7. A device according to claim 1, characterized in that the magnetic flux sensors (101 to 104) are constituted by coils disposed around the acceleration channel (24).

8. A device according to claim 7, characterized in that it comprises a plurality of coils serving as magnetic flux sensors (101, 104; 102, 103) disposed coaxially with the acceleration channel (24) in various radial planes of the acceleration channel (24).

9. A device according to claim 7, characterized in that at least some of the magnetic flux sensors are constituted by coils (31 to 33) fed with DC and forming part of said magnetic field creation means, and in that said magnetic flux sensors constituted by coils (31 to 33) fed with DC are connected to respective amplifiers (111) via respective filters (163) eliminating the DC component.

10. A device according to claim 1, characterized in that the signals from the summing circuit (115; 186; 195) are applied to a negative feedback loop (190; 196) in a circuit for controlling a valve (191) that regulates the ionizable gas feed means (41, 26) in such a manner as to maintain the accelerator at constant thrust equal to a predetermined value.

11. A device according to claim 10, characterized in that the feedback loop (190) is of the digital type, and the reference value for the thrust is stored in a memory (189).

12. A device according to claim 10, characterized in that the negative feedback loop (196) is of the analog type, and the reference value for the thrust is provided from a mass flow meter (197) associated with the ionizable gas feed means (41, 26).

* * * * *

UNITED STATES PATENT AND TRADEMARK OFFICE
CERTIFICATE OF CORRECTION

PATENT NO. : 5,509,266
DATED : April 23, 1996
INVENTOR(S) : Alexei Morozov, et al.

It is certified that error appears in the above-indentified patent and that said Letters Patent is hereby corrected as shown below:

Title page, item [54], "ACCELERATION" should read --ACCELERATOR--.

Column 1, line 3, Title, "ACCELERATION" should read --ACCELERATOR--.

Column 3, line 17, ".that" should read --that--.

Column 5, line 30, "F=α∫jpe Hz dV i.e. F=αJpe..." should read -- $F = a \int jpe\ Hz\ dV$ i.e. $F = a\ Jpe...$ --.

Signed and Sealed this

Fourth Day of August, 1998

Attest:

BRUCE LEHMAN

Attesting Officer

Commissioner of Patents and Trademarks